(12) United States Patent
Sandoval

(10) Patent No.: US 7,718,990 B2
(45) Date of Patent: May 18, 2010

(54) ACTIVE MATERIAL DEVICES WITH CONTAINMENT LAYER

(75) Inventor: Regino Sandoval, Rochester Hills, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 11/999,158

(22) Filed: Dec. 4, 2007

(65) Prior Publication Data
US 2009/0140229 A1   Jun. 4, 2009

(51) Int. Cl.
*H01L 29/02* (2006.01)
(52) U.S. Cl. ............... 257/2; 257/3; 257/4; 257/E29.02; 438/102; 365/163
(58) Field of Classification Search ............. 257/1–5, 257/E29.002; 438/102–103; 365/163
See application file for complete search history.

(56) References Cited

U.S. PATENT DOCUMENTS

2003/0049912 A1* 3/2003 Campbell et al. ......... 438/385
2004/0109351 A1* 6/2004 Morimoto et al. ......... 365/171
2005/0002227 A1* 1/2005 Hideki et al. .............. 365/163
2006/0131618 A1* 6/2006 Hsueh ....................... 257/246

* cited by examiner

*Primary Examiner*—Bradley K Smith
*Assistant Examiner*—Jami M Valentine
(74) *Attorney, Agent, or Firm*—Kevin L. Bray

(57) ABSTRACT

An active material electronic device with a containment layer. The device includes an active chalcogenide, pnictide, or phase-change material in electrical communication with an upper and lower electrode. The device includes a containment layer formed over the active material that prevents escape of volatilized matter from the active material when the device is exposed to high temperatures during fabrication or operation. The containment layer further prevents chemical contamination of the active material by protecting it from reactive species in the processing or ambient environment. Once the containment layer is formed, the device may be subjected to high temperature or chemically aggressive environments without impairing the compositional or structural integrity of the active material.

28 Claims, 11 Drawing Sheets

Energy or Current

ACTIVE MATERIAL DEVICES WITH CONTAINMENT LAYER

FIELD OF INVENTION

This invention relates to electronic devices having volatile active materials susceptible to evaporation during processing or operation at elevated temperatures. More particularly, this invention relates to methods of making electronic devices that include protective steps designed to prevent evaporation of active materials during fabrication or operation. Most particularly, this invention relates to methods of making chalcogenide or phase-change memory or switching devices that include low temperature deposition of a containment layer to confine a volatile active material during subsequent high temperature processing or operation.

BACKGROUND OF THE INVENTION

Chalcogenide materials are an emerging class of commercial electronic materials that exhibit switching, memory, logic, and processing functionality. The basic principles of chalcogenide materials were developed by S. R. Ovshinsky in the 1960's and much effort by him and others around the world since then have led to advancements of the underlying science and an expansion of the field of application of chalcogenide materials.

Early work in chalcogenide devices demonstrated electrical switching behavior in which switching from a resistive state to a conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultra fast switching speeds over many cycles of operation. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p.1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference.

Another important application of chalcogenide materials is in electrical and optical memory devices. One type of chalcogenide memory device utilizes the wide range of resistance values available for the active chalcogenide material as the basis of memory operation. Each resistance value corresponds to a distinct structural state of the chalcogenide material and one or more of the states can be selected and used to define operational memory states. Chalcogenide materials exhibit a crystalline state or phase as well as an amorphous state or phase. Different structural states of a chalcogenide material differ with respect to the relative proportions of crystalline and amorphous phase in a given volume or region of chalcogenide material. The range of resistance values is bounded by a set state and a reset state of the chalcogenide material. The set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Each memory state of a chalcogenide memory material corresponds to a distinct range of resistance values and each memory resistance value signifies unique informational content. Operationally, the chalcogenide material can be programmed into a particular memory state by providing energy, most commonly an electric current pulse of appropriate amplitude and duration, to transform the chalcogenide material into the structural state having the resistance value associated with the particular informational content to be stored. By controlling the amount of energy provided to a chalcogenide material, it is possible to control the relative proportions of crystalline and amorphous phase regions within a volume of the material and to thereby control the structural (and memory) state of the chalcogenide material.

Each memory state can be programmed by providing the current pulse characteristic of the state and each state can be identified or read in a non-destructive fashion by measuring the resistance. Programming among the different states is fully reversible and the memory devices can be written and read over a repeated number of cycles to provide robust and reliable operation. The variable resistance memory functionality of chalcogenide materials is currently being exploited in the OUM (Ovonic Universal (or Unified) Memory) devices that are expected to appear on the market soon. Basic principles and operation of OUM type devices are presented, for example, in U.S. Pat. Nos. 6,859,390; 6,774,387; 6,687,153; and 6,314,014; the disclosures of which are incorporated by reference herein as well as in several journal articles including "Low Field Amorphous State Resistance and Threshold Voltage Drift in Chalcogenide Materials", published in IEEE Transactions on Electron Devices, vol. 51, p. 714-719 (2004) by Pirovana et al.; and "Morphing Memory" published in IEEE Spectrum, vol. 167, p. 363-364 (2005) by Weiss.

The behavior (including switching, memory, and accumulation) and chemical compositions of chalcogenide materials included within the scope of this invention have been described, for example, in U.S. Pat. Nos. 6,671,710; 6,714,954; 6.087,674; 5,166,758; 5,296,716; 5,536,947; 5,596,522; 5,825,046; 5,687,112; 5,912,839; and 3,530,441, the disclosures of which are hereby incorporated by reference. These references also describe proposed mechanisms that govern the behavior of the chalcogenide materials. The references also describe the structural transformations from the crystalline state to the amorphous state (and vice versa) via a series of partially crystalline states in which the relative proportions of crystalline and amorphous regions vary underlying the operation of electrical and optical chalcogenide materials. Similar structural transformations have been reported more recently for the pnictide family of materials.

Current development of the chalcogenide materials and devices is also oriented toward the fabrication of arrays of devices. Chalcogenide materials offer the promise of high density memory, logic and neural arrays that can operate according to traditional binary data storage or according to a multilevel scheme. Chalcogenide arrays further offer the prospect of integrating, on a single chip, both memory and processing capabilities, thereby enabling high speed operation.

In order to expand the commercial opportunities for chalcogenide or pnictide phase-change memories, it is necessary to identify phase-change materials, device structures, and methods of programming that lead to optimized performance. Among the desirable operational characteristics are a high contrast between the resistances of the reset state and set state, low reset current, scalability of performance with decreasing device size, fast crystallization, reproducible performance over multiple cycles of operation, avoidance or inhibition of atomic migration, compositional stability, good adhesion between the active phase-change material and the electric contacts and surrounding layers of the device, stable long term storage of data, and consistent performance over a wide range of ambient conditions (including temperature and working environment).

An important commercial requirement for chalcogenide or other phase-change memory devices is endurance. Practical memories must function over an extended number of operational read/write cycles. Most current chalcogenide or phase-change memory devices are capable of operating for several million cycles before failure occurs. Various modes of failure have been identified as limiting the cycle life of chalcogenide or phase-change devices. Modes of failure include a stuck set condition, a stuck reset condition, open circuit failure, and shunting. To facilitate commercialization of chalcogenide or phase-change memory devices, it is desirable to extend the cycle life to at least several billion cycles of operation. In order to achieve this goal, it is necessary to understand the mechanisms of failure and to devise strategies for preventing failure.

SUMMARY OF THE INVENTION

The instant invention provides electronic devices having a contained active material. The active material may be a memory material, switching material, chalcogenide material, pnictide material, or phase-change material. In the device, the active material is in electrical communication with a lower electrode and an upper electrode. The upper electrode is capped with a containment layer to prevent or inhibit volatilization of the active material during high temperature steps in the fabrication process or during operation when high temperatures are produced locally within the active material during the programming process. The containment layer further protects the active material from chemical contamination from the processing environment during fabrication or the ambient environment during operation. The upper electrode may be deposited conformally or non-conformally over the active material. The upper electrode may be a single conductive layer or a stack of two or more conductive layers which may differ in resistivity. A diffusion barrier layer and/or breakdown layer may optionally be included between the active material and either or both of the upper and lower electrodes. The containment layer may be deposited conformally or non-conformally over the upper electrode.

The containment layer acts to seal the active material by blocking physical access to and away from it. During fabrication or operation, the device is often exposed to high temperatures that promote volatilization and volumetric loss of the active material. Escape of volatilized material can occur through pores or seams of non-conformal layers deposited over the active material. The containment layer is formed over the last of the non-conformal layers at a sufficient coverage to block the pores. As a result, volatilized matter is prevented from escaping and chemical contaminants present in the ambient or processing environment are prevented from interacting with the active material. The containment layer provides a cap that prevents or inhibits both the escape of volatile species from the active layer and migration of gaseous species from the ambient or processing environment to the active layer.

In an embodiment, the electronic device includes an active material in electrical communication with a lower electrode and an upper electrode in electrical communication with the active material, where the upper electrode is formed at a temperature low enough to prevent significant volatilization of the active material. The device further includes a containment layer formed over the upper electrode, where the containment layer is also formed at a temperature low enough to prevent significant volatilization of the active material. The containment layer may be an insulator or conductor and may include a plurality of layers.

The instant invention further provides a method of fabricating an electronic device. The method includes the steps of depositing a lower electrode on a substrate, depositing an insulator over the lower electrode, forming an opening in the insulator, optionally depositing a breakdown layer and/or diffusion barrier layer over the opening, depositing an active material over the opening, and depositing a top electrode over the active material. The method further includes the step of depositing a containment layer over the top electrode. In a preferred embodiment, the top electrode and containment layer deposition steps are performed at a temperature sufficiently low to prevent or inhibit volatilization or sublimation of constituents of the active material. The containment layer may be a conductive or insulating layer and is deposited at a sufficient coverage to prevent exposure of the underlying active material layer to the ambient processing environment. The method may further include additional processing steps at temperatures high enough to permit volatilization of the active material in corresponding structures lacking the instant containment layer.

DETAILED DESCRIPTION OF THE ILLUSTRATED EMBODIMENTS

Figure 1:
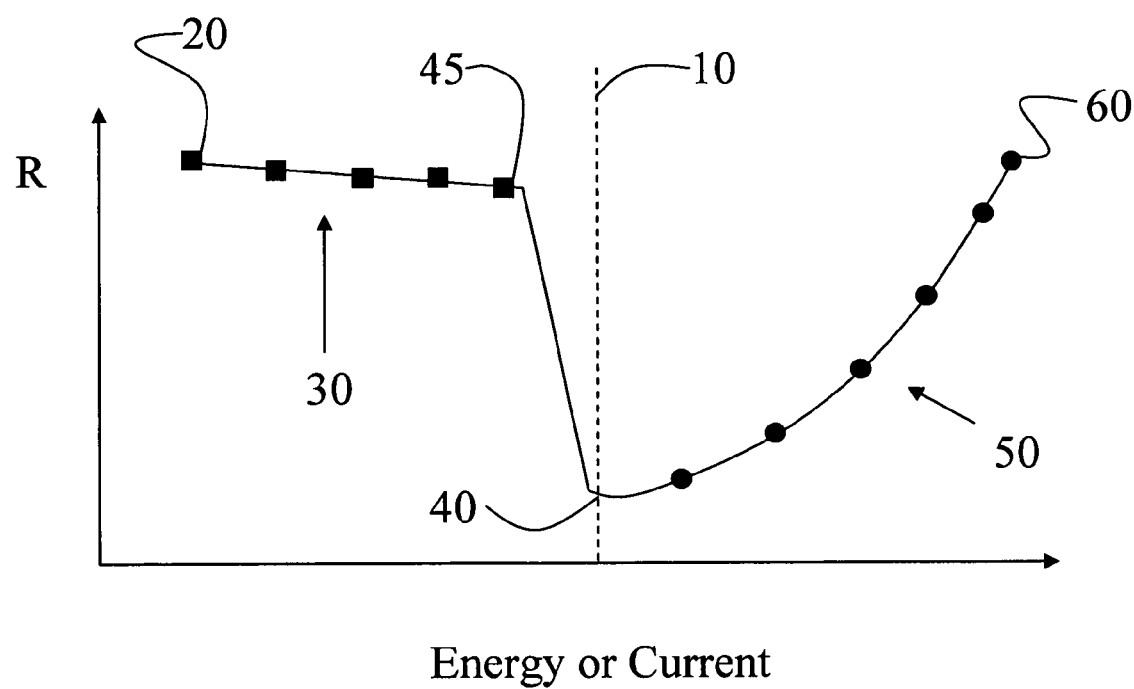
FIG. 1 depicts a schematic resistance vs. energy/current plot for a phase-change material.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

The instant invention provides electronic devices and methods of making electronic devices that include an active layer having memory or switching functionality. The active layer is in electrical communication with a lower electrode and an upper electrode. Application of an appropriate electrical signal (voltage or current) between the lower electrode and upper electrode and through the active layer effects a transformation in the active layer that provides for a memory or switching functionality. Active layer materials in accordance with the instant invention include chalcogenide materials, pnictide materials, phase-change materials, and switching materials (including Ovonic threshold switching materials).

In order to appreciate the benefits of the instant invention, it is helpful to review the basic operational characteristics of a representative active layer material. The following discussion focuses on chalcogenide phase-change materials as illustrative active layer materials having memory functionality. The basic principles presented in the following discussion apply equally to other forms of phase-change or state-change materials, such as pnictides or other classes of materials transformable between two or more states distinguishable on the basis of structure, physical property, electrical property or chemical property. The operational characteristics of Ovonic threshold switching materials are discussed in U.S. Pat. Nos. 3,271,591; 5,543,737; 5,694,146; and 5,757,446; the disclosures of which are hereby incorporated by reference.

An important feature of the chalcogenide materials in the operation of chalcogenide memory devices and device arrays is their ability to undergo a phase transformation between or among two or more structural states. The chalcogenide materials have structural states that include a crystalline state, one or more partially-crystalline states and an amorphous state. The crystalline state may be a single crystalline state or a polycrystalline state. As used herein, a partially-crystalline state refers to a structural state of a volume of chalcogenide material that includes an amorphous portion and a crystalline portion. Generally, a plurality of partially-crystalline states exists for the phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the partially-crystalline states have a fractional volume percentage of crystalline material that varies continuously between 0% (the amorphous limit) and 100% (the crystalline limit). Phase-change chalcogenide materials are thus able to transform among a plurality of structural states that vary inclusively between fractional volume percentage of crystalline material of 0% and 100%.

Transformations among the structural states of a chalcogenide material are induced by providing energy to the chalcogenide material. Energy in various forms can influence the fractional crystallinity of a chalcogenide material and hence induce structural transformations. Suitable forms of energy include electrical energy, thermal energy, optical energy or other forms of energy (e.g. particle-beam energy) that induce electrical, thermal or optical effects in a chalcogenide material or combinations of the foregoing forms of energy. Continuous and reversible variability of the fractional crystallinity is achievable by controlling the energy environment of a chalcogenide material. A crystalline state can be transformed to a partially-crystalline or an amorphous state, a partially-crystalline state can be transformed to a crystalline or amorphous state as well as to another partially crystalline state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur in a practical time period. The driving force for crystallization is typically thermodynamic in that the free energy of a crystalline or partially-crystalline state is lower than the free energy of an amorphous state so that the overall energy of a chalcogenide material decreases as the fractional crystallinity increases. Formation (nucleation and growth) of a crystalline state or crystalline domains within a partially-crystalline state is kinetically enabled, so that heating below the melting point promotes crystallization by providing energy that facilitates the rearrangements of atoms needed to form a crystalline phase or domain. The fractional crystallinity of a partially-crystalline state can be controlled by controlling the temperature or time of heating of the partially-crystalline state or by controlling the temperature or rate of cooling of an amorphous or partially-crystalline state.

The use of electrical energy to induce structural transformations relies on the application of electrical (current or voltage) pulses to a chalcogenide material. The mechanism of electrically induced structural transformations may be electronic in nature with an accompanying or consequent thermal contribution. By controlling the magnitude and/or duration of electrical pulses applied to a chalcogenide material, it is possible to vary continuously the fractional crystallinity. The influence of electrical energy on the structure of a chalcogenide material is frequently depicted in terms of the variation of the electrical resistance of a chalcogenide material with the amount of electrical energy provided or the magnitude of the current or voltage pulse applied to a chalcogenide material. A representative depiction of the electrical resistance (R) of a chalcogenide material as a function of electrical energy or current pulse magnitude (Energy/Current) is presented in FIG. 1 herein. FIG. 1 shows the variation of the electrical resistance of a chalcogenide material resulting from electrical energy or current pulses of various magnitude and may generally be referred to as a resistance plot.

The resistance plot includes two characteristic response regimes of a chalcogenide material to electrical energy. The regimes are approximately demarcated with the vertical dashed line 10 shown in FIG. 1. The regime to the left of the line 10 may be referred to as the accumulating regime of the chalcogenide material. The accumulation regime is distinguished by a nearly constant or gradually varying electrical resistance with increasing electrical energy that culminates in an abrupt decrease in resistance at and beyond a critical energy (which may be referred to herein as the set energy). The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or sloping. The left side of the resistance plot is referred to as the accumulating regime because the structural state of the chalcogenide material continuously evolves as energy is applied, with the fractional crystallinity of the structural state correlating with the total accumulation of applied energy. The leftmost point 20 corresponds to the structural state in the accumulating regime having the lowest fractional crystallinity and may be referred to as the reset state. This state may be fully amorphous or may be primarily amorphous with some degree of crystalline content.

As energy is added to the reset state, the fractional crystallinity increases, and the chalcogenide material transforms in the direction of increasing applied energy among a plurality of partially-crystalline states along the plateau 30. Selected accumulation states (structural states in the accumulation region) are marked with squares in FIG. 1. Upon accumulation of a sufficient amount of applied energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing fractional crystallinity within the plateau region 30 and are reversible only by first resetting the chalcogenide material to reset state 60. The behavior illustrated in FIG. 1 is reproducible over many cycles of setting and resetting a device containing a chalcogenide material by applying the requisite energy or current. Once the reset state is obtained, lower amplitude current pulses can be applied and the accumulation response of the chalcogenide material can be retraced. It is thus possible to cycle between the set and reset states over multiple cycles, a necessary feature for long memory cycle life.

While not wishing to be bound by theory, the instant inventors believe that the addition of energy to a chalcogenide material in the accumulating regime leads to an increase in fractional crystallinity through the nucleation of new crystalline domains or growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material between the two device electrodes. This type of crystallization may be referred to as sub-percolation crystallization. The setting transformation coincides with a percolation threshold in which a contiguous, interconnected crystalline network forms within the chalcogenide material between the two device electrodes. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinity until the percolation threshold is reached and the setting transformation occurs.

The regime to the right of the line 10 of FIG. 1 may be referred to as the grayscale or direct overwrite regime. The direct overwrite regime extends from the set state 40 through a plurality of intermediate states (generally depicted by 50) to a reset point or state 60. The various points in the direct overwrite regime may be referred to as grayscale or direct overwrite states of the chalcogenide material. Selected direct overwrite states are marked with circles in FIG. 1. Structural transformations in the direct overwrite regime may be induced by applying an electric current or voltage pulse to a chalcogenide material. In FIG. 1, an electric current pulse is indicated. In the direct overwrite regime, the resistance of the chalcogenide material varies with the magnitude of the applied electric pulse. The resistance of a particular direct overwrite state is characteristic of the structural state of the chalcogenide material, and the structural state of a chalcogenide material is dictated by the magnitude of the current pulse applied. In this regime, the fractional crystallinity of the chalcogenide material decreases as the magnitude of the current pulse increases. The fractional crystallinity is highest for direct overwrite states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the grayscale region.

In contrast to the accumulating region, structural transformations that occur in the direct overwrite region are reversible and bidirectional. As indicated hereinabove, each state in the direct overwrite region may be identified by its resistance and a current pulse magnitude, where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the reset state along the resistance curve in the direct overwrite regime. Similarly, if the subsequent current pulse has a lower magnitude than the pulse used to establish the initial state, the fractional crystallinity of the chalcogenide material increases and the structural state is transformed from the initial state in the direction of the set state along the resistance curve in the direct overwrite regime.

In OUM (Ovonic Unified (or Universal) Memory) applications, the direct overwrite states of the chalcogenide material are used to define memory states of a memory device. Most commonly, the memory devices are binary memory devices that utilize two of the direct overwrite states as memory states, where a distinct data value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value as exemplified by the range of direct overwrite states 50 in FIG. 1. The operation of transforming a chalcogenide material to the structural state associated with a particular memory state may be referred to herein as "programming" the chalcogenide material or "writing to" the chalcogenide material or storing information in the chalcogenide material.

To facilitate readout and to minimize readout error, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{55}$, a thickness of ~600 Å, and pore diameter of below ~0.1 μm in a typical two-terminal device structure, for example, the resistance of the reset state is ~100-1000 kΩ and the resistance of the set state is under ~10 kΩ. Phase-change materials in general show resistances in the range of ~50 kΩ to ~2000 kΩ in the reset state and resistance of ~0.5 kΩ to ~50 kΩ in the set state. In the preferred phase-change materials, the resistance of the reset state is at least a factor of two, and more typically an order of magnitude or more, greater than the resistance of the set state. In addition to binary (single bit) memory applications, chalcogenide materials may be utilized as non-binary or multiple bit memory materials by selecting three or more states from among the direct overwrite states and associating a data value with each state, where each memory state corresponds to a distinct structural state of the chalcogenide and is characterized by a distinct resistance value.

Representative compositions of chalcogenide materials have been discussed in U.S. Pat. Nos. 5,543,737; 5,694,146; 5,757,446; 5,166,758; 5,296,716; 5,534,711; 5,536,947; 5,596,522; and 6,087,674; the disclosures of which are hereby incorporated by reference in their entirety herein. The chalcogenide materials generally include one or more elements from column VI of the periodic table (the chalcogen elements) and optionally one or more chemical modifiers from columns III, IV or V. One or more of S, Se, and Te are the most common chalcogen elements included in a chalcogenide phase-change material. Suitable modifiers include one or more of trivalent and tetravalent modifying elements such as As, Ge, Ga, Si, Sn, Pb, Al, Sb, In, and Bi. Transition metals such as Cu, Ni, Zn, Ag, and Cd may also be used as modifiers. A preferred chalcogenide composition includes one or more chalcogenide elements along with one or more trivalent or tetravalent modifiers and/or one or more transition metal modifiers. Materials that include Ge, Sb, and/or Te, such as $Ge_2Sb_2Te_5$, are examples of chalcogenide materials in accordance with the instant invention. Other examples of phase-change materials include, but are not limited to, GaSb, InSb, InSe, $Sb_2Te_3$, GeTe, $Ge_2Sb_2Te_5$, ternary Ge—Sb—Te compositions, InSbTe, ternary In—Sb—Te compositions, ternary GaSeTe compositions, TAG and other ternary Te—As—Ge compositions, GaSeTe, $SnSb_2Te_4$, InSbGe, ternary In—Sb—Ge compositions, AgInSbTe, quaternary Ag—In—Sb—Te compositions, (GeSn)SbTe, quaternary Ge—Sn—Sb—Te compositions, GeSb(SeTe), quaternary Ge—Sb—Se—Te compositions, and $Te_{81}Ge_{15}Sb_2S_2$ and quaternary Te—Ge—Sb—S compositions.

U.S. Pre-Grant Pub. 20070034850, the disclosure of which is hereby incorporated by reference in its entirety, discloses phase-change materials having reduced Ge and/or Te content. Representative materials include those comprising Ge and Sb, where the atomic concentration of Ge is less than or equal to 20% and the atomic concentration of Sb is greater than or equal to 30%. In another embodiment, the atomic concentration of Ge is less than or equal to 16% and the atomic concentration of Sb is greater than or equal to 40%. In still another embodiment, the atomic concentration of Ge is less than or equal to 12% and the atomic concentration of Sb is greater than or equal to 50%. In other embodiments, the chalcogenide material includes the foregoing atomic concentrations of Sb and an atomic concentration of Ge between 11% and 19%, more preferably between 13% and 18% and most preferably between 15% and 17%. In still other embodiments, the instant chalcogenide material includes Ge and Sb in the atomic concentrations listed above and further includes Te. In one embodiment, the atomic concentration of Te is less than or equal to 50% and more preferably between 20% and 50%. In another embodiment, the atomic concentration of Te is less than or equal to 40% and more preferably between 30% and 40%. In another embodiment, the atomic concentration of Te is less than or equal to 30%.

U.S. Pre-Grant Pub. 20070034851, the disclosure of which is hereby incorporated by reference in its entirety, discloses phase-change materials including Ge, Sb, and/or Te, where the atomic concentration of Ge is generally in the range from 11%-22%, the atomic concentration of Sb is generally in the range from 22%-65%, and the atomic concentration of Te is generally in the range from 28%-55%. In one embodiment, the materials include an atomic concentration of Ge in the range from 13%-20%, an atomic concentration of Sb in the range from 28%-43%, and an atomic concentration of Te in the range from 43%-55%. In another embodiment, the materials include an atomic concentration of Ge in the range from 15%-18%, an atomic concentration of Sb in the range from 32%-35%, and an atomic concentration of Te in the range from 48%-51%.

An important practical requirement for phase-change memory devices is the ability of the device to perform reliably and reproducibly over multiple cycles of operation. The longevity of phase-change memory devices is controlled by the consistency of resistance values upon application of programming pulses having a particular set of pulse energy characteristics (e.g. pulse duration, pulse shape, pulse amplitude). When a particular programming pulse is applied in the direct overwrite memory region, it is necessary for the resistance of the device to transform to its expected value and for this value to occur reproducibly over the full operational life of the device.

A common mode of failure of phase-change memory devices occurs when resistance values are no longer reproducibly established as expected upon application of a particular programming pulse. In binary operation, for example, it is common to cycle between the set state and reset state. The set state is programmed with a set pulse and the reset state is programmed with a reset pulse. The set pulse is commonly a relatively low amplitude, long duration pulse and the reset pulse is commonly a relatively high amplitude, short duration pulse. (For background information on pulse attributes needed to program and read phase-change memory devices see, for example, U.S. Pat. No. 6,570,784 to Lowrey, the disclosure of which is hereby incorporated herein in its entirety.) In some instances after repeated cycles of operation, the device fails because the set pulse is no longer capable of transforming the phase-change material to its set state. The device instead remains in its reset state despite being subjected to a programming pulse. This mode of failure may be referred to as a "stuck reset condition" or "stuck reset failure". In other instances after repeated cycles of operation, the device fails because the reset pulse is no longer capable of transforming the phase-change material to its reset state. Instead, the device remains in its set state despite being subjected to a programming pulse. This mode of failure may be referred to as a "stuck set condition" or "stuck set failure". Other modes of failure include open circuit failure and short circuit failure.

The instant invention provides a solution to the problem of extending the cycle life of active material devices. One factor believed to contribute to device failure is volatilization of the active material during fabrication or operation of the device. As used herein, volatilization refers to sublimation, evaporation, or other loss of the active material or components thereof due to electrical or thermal causes. Chalcogenide materials, phase-change materials, Ovonic threshold switching materials, and other active materials within the scope of the instant invention are frequently relatively low melting materials. As a result, they are susceptible to volatilization when placed in a high temperature environment. High temperatures may occur, for example, during the processing of the active material device. Processing steps subsequent to deposition of the active material frequently necessitate exposing the device to high temperatures. Steps such as annealing, deposition of surrounding insulating layers, deposition of the upper electrode, and deposition of conductive plugs and/or their liners (which provide an interconnection between the upper contact and other levels of conductive interconnect, grid lines or external circuitry) are often performed at temperatures near or above the volatilization temperature of the active material. Surrounding insulating layers are included for purposes of isolating devices in an array and protecting the active material from external contaminants and are typically formed at relatively high temperatures via high density plasma, plasma enhanced chemical vapor deposition, or chemical vapor deposition process. Oxides and nitrides are commonly used as insulating layers. In addition to processing, high temperatures may also be induced internally within the active layer during normal programming or operation of the device. As described hereinabove, for example, programming of phase-change memory materials may require application of electrical currents sufficient to heat a phase-change material to or above its melting temperature when quenching to an amorphous phase is desired. As a further example, programming of phase-change memory materials may require application of electrical currents sufficient to heat a phase-change material to or above its volatilization temperature when performing a structural change to a crystalline phase is desired.

Exposure of an active material to high temperatures may be deleterious because high temperatures may lead to volatilization of the active material. Volatilization is undesirable for two main reasons. First, in multicomponent active materials, the different components may volatilize to differing degrees in a particular thermal environment. As a result, the composition of the remaining non-volatilized portion of the active material changes upon exposure to high temperatures. Compositional variations may alter the performance characteristics of the active layer and contribute to premature failure of the device. Second, volatilization of the active material creates a spatial void within the device structure. If the active material volatilizes and matter is permitted to escape the device structure, voids are created in the active region of the device. Voids correspond to empty regions or gaps within the active region and are undesirable because they may affect electrical performance of the device and/or contribute to premature failure.

The instant invention seeks to prevent or inhibit volatilization of the active material by protecting it with a containment layer before exposing the device to temperatures conducive to volatilization. The containment layer provides a seal that spatially confines the active material and blocks escape of the active material when the device is exposed to high processing temperatures or subjected to high temperatures during operation. In a preferred embodiment, the containment layer is formed after deposition of the active layer, but before the device is subjected to a processing step or operational step that exposes the active layer to a temperature conducive to volatilization. The containment layer itself is formed at a temperature insufficient to appreciably volatilize the active layer. In one embodiment, the containment layer is formed at a temperature less than or equal to 80% of the volatilization temperature of the active layer. In another embodiment, the containment layer is formed at a temperature less than or equal to 65% of the volatilization temperature of the active layer. In still another embodiment, the containment layer is formed at a temperature less than or equal to 50% of the volatilization temperature of the active layer. Many chalcogenide phase-change materials volatilize at temperatures between 300° C. and 400° C. For a chalcogenide phase-change material that volatilizes at 350° C., the containment layer is formed in one embodiment at a temperature less than or equal to 280° C. In another embodiment, the containment layer is formed at a temperature of less than or equal to 228° C. In still another embodiment, the containment layer is formed at a temperature of less than or equal to 175° C. For a chalcogenide phase-change material that volatilizes at 400° C., the containment layer is formed in one embodiment at a temperature less than or equal to 320° C. In another embodiment, the containment layer is formed at a temperature of less than or equal to 260° C. In still another embodiment, the containment layer is formed at a temperature of less than or equal to 200° C.

In one embodiment, the containment layer is formed immediately following deposition of the active layer. In another embodiment, one or more additional layers may be formed at temperatures insufficient to appreciably volatilize the active layer before the containment layer is formed. The upper electrode, for example, may be formed via a low temperature process directly on the active material and the containment layer may then be formed directly on the upper electrode. Once the containment layer is formed, the active material is protected against volatilization and subsequent processing or operation at high temperatures may occur without compromising the integrity of the active material.

Figure 2:
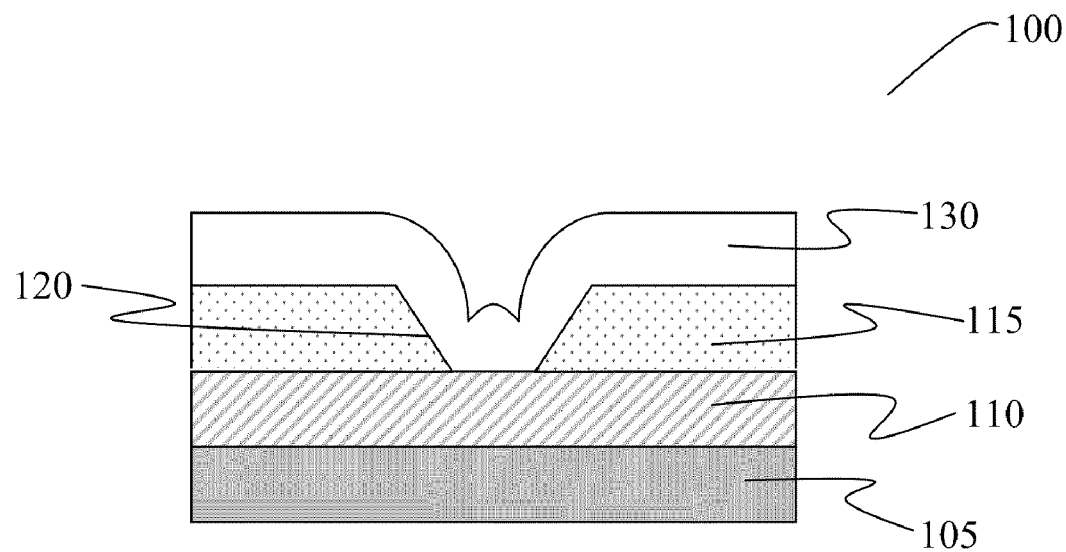
FIG. 2 depicts an active material electronic device at an intermediate stage of fabrication.

FIG. 2 depicts an active material device 100 at an intermediate stage of fabrication. The device includes lower electrode 110 formed on substrate 105. Substrate 105 is typically a silicon wafer that may include transistors, diodes, n-doped regions, p-doped regions or other circuits or components needed to access or operate the device. Lower electrode 110 is a conductive layer, typically a metal, metal alloy, metal compound, or carbon. Representative lower electrode materials include Ti, TiN, TiAlN, TiSiN, TiW, C, W, Mo, MoN, and TaN. Insulator layer 115 is formed over lower electrode 110. Insulator layer 115 is most commonly an oxide (e.g. $SiO_2$) or nitride (e.g. $Si_3N_4$) and includes an opening. In the embodiment shown in FIG. 2, the opening of insulator layer 115 has sloped sidewalls 120. In other embodiments, the sidewalls may be substantially vertical. The opening establishes an area of contact between the lower electrode and active material 130. In order to minimize the energy required to program the device, it is desirable to minimize the area of contact. The opening may be formed using standard lithographic techniques (e.g. masking and etching) to achieve lithographic dimensions. The opening may be shaped as a hole, trench, or depression. Optionally, as is known in the art, sublithographic dimensions may be achieved by including a sidewall spacer within the opening (not shown in FIG. 2).

Active material 130 is formed over insulator layer 115 and within the opening of insulator layer 115. Active materials such as chalcogenide and phase-change materials are often formed in a sputtering or other non-conformal process. In a non-conformal process, active material 130 may not densely fill the opening of insulator layer 115. Instead, the opening may be incompletely filled with active material 130. In addition, the surface of active material 130 may not parallel the surface of contact with insulator layer 115. As seen in FIG. 2, the shape of the upper surface of active material 130 deviates from the shape of the opening of insulator layer 115. While the opening includes linearly-sloped sidewalls 120 and a flat bottom, active material 130 includes a curved upper surface in the vicinity of the opening and an irregular fill toward the center of the opening. These effects become more pronounced as the size of the opening decreases when non-conformal deposition techniques are used to form active material 130.

Although not shown in FIG. 2, an optional barrier layer may be formed over insulator 115 between lower electrode 110 and active material 130. As is known in the art, barrier layers are typically thin layers that act to prevent the transfer (by way of diffusion or electromigration) of atomic constituents back and forth between active material 130 and lower electrode 110. Instead of or in addition to a barrier layer, a breakdown layer (not shown in FIG. 2) may also be formed between active material 130 and lower electrode 110. As is known in the art, a breakdown layer is a thin insulating layer used to reduce the effective area of contact between lower electrode 110 and active material 130. During conditioning of the device, an electrical signal punctures the breakdown layer to create a localized, small area conductive pathway from the lower electrode 110 to active material 130. The rest of the breakdown layer remains intact and provides a resistive barrier that channels the flow of electrical current from the lower electrode to the conductive punctured region.

At the stage of fabrication shown in FIG. 2, electronic device 100 is incomplete and further deposition and processing steps are needed to finish fabrication. At this point of fabrication, active layer 130 is exposed to the processing environment and is subject to thermal degradation (volatilization), chemical degradation, and chemical contamination from subsequent fabrication steps. In a typical fabrication scheme, an upper electrode 140 is formed on active material 130. (See FIG. 3) Deposition techniques such as chemical vapor deposition (CVD) or metalorganic chemical vapor deposition (MOCVD) are desirable for the formation of upper electrode 140 because they provide conformal deposition, but suffer from the drawback of requiring high deposition temperatures (e.g. 350° C. or higher) based on currently available precursors for common upper electrode materials. If upper electrode 140 is formed in a high temperature deposition process, the high ambient temperature produced in the deposition environment causes volatilization of active layer 130 and compromises the compositional and structural integrity of active layer 130.

To reduce volatilization of active layer 130, a low temperature deposition process such as sputtering is used to provide upper electrode 140. Sputtering, however, suffers from the drawback of providing non-conformal coverage of active layer 130. A sputtered film is an aggregation of atomic or molecular fragments from the target material. Fragments of the target material are ejected by energetic bombardment of the target in a sputtering process and are transported by kinetic energy to the deposition surface. The fragments deposit randomly on the deposition surface to provide a porous layer of a material having a composition that approximates that of the target material. Other non-conformal techniques, such as evaporation, similarly provide structurally non-uniform and non-dense coverage of the deposition surface.

The disadvantages of a porous upper electrode layer 140 become manifest in subsequent processing. Once upper electrode layer 140 is formed, further fabrication of electronic device 100 can proceed according to several schemes. In one scheme, the device is annealed to densify (sinter) active layer 130 and/or upper electrode 140. The porous structure that results from the non-conformal deposition of active layer 130 and upper electrode 140 is undesirable from an operational standpoint because the gaps or pores in the structure affect the reliability and reproducibility of electrical performance. The Joule heating, for example, that accompanies current flow may alter the porous structure upon repeated cycling and lead to changes in the resistivity of the active layer 130 or upper electrode 140. Changes in resistivity alter the characteristics of the pulses needed to program or read the device. The presence of gaps or pores or voids (and their migration upon cycling) can facilitate open circuit failure if the physical area of contact between active layer 130 and upper electrode 140 is reduced over time upon cycling.

To avoid the drawbacks of the porous structure, active layer 130 and upper electrode 140 can be subjected to a high temperature anneal to consolidate the structure and provide a more uniform and densely packed layer. In order to effectively anneal the structure, temperatures of over 300-450° C. may be required for 5-60 minutes. During the time of the anneal, however, active layer 130 is exposed to temperatures sufficient to significantly volatilize it. When upper electrode 140 has a porous structure, it includes pores through which volatilized active layer material can escape. As discussed hereinabove, volatilization of active layer 130 generally leads to a variation in the composition of the non-volatilized portion of active layer 130 from its intended composition due to differences in the relative volatility of its different atomic constituents. The volumetric loss of active layer material also counteracts the consolidation desired from the annealing process and can result in voids that compromise electrical performance.

Figure 4:
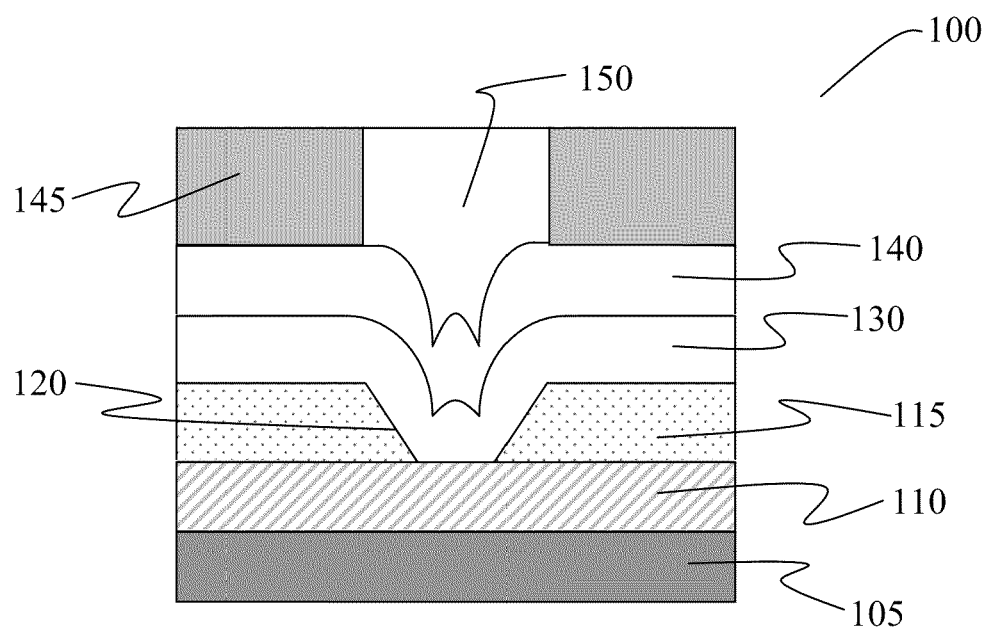
FIG. 4 depicts the device of FIG. 3 with the further inclusion of a conductive plug.

High temperature processing environments also arise in steps other than annealing. In array structures, for example, it may be necessary to make contact from upper electrode 140 to external addressing lines. One way to make contact is to form a vertical conductive plug above upper electrode 140. FIG. 4 is a schematic depiction of a representative plug structure. The device includes insulator layer 145 that includes an opening that is filled with plug 150, where plug 150 provides electrical communication between active layer 130 and the surroundings. The most common plug material, tungsten, requires deposition at temperatures well above 300° C. and entails exposing active layer 130 to conditions conducive to volatilization for an extended period of time. If upper electrode 140 is porous, volatilized matter from active layer 130 escapes and the composition and structural integrity of active layer 130 are compromised as described hereinabove.

Figure 5:
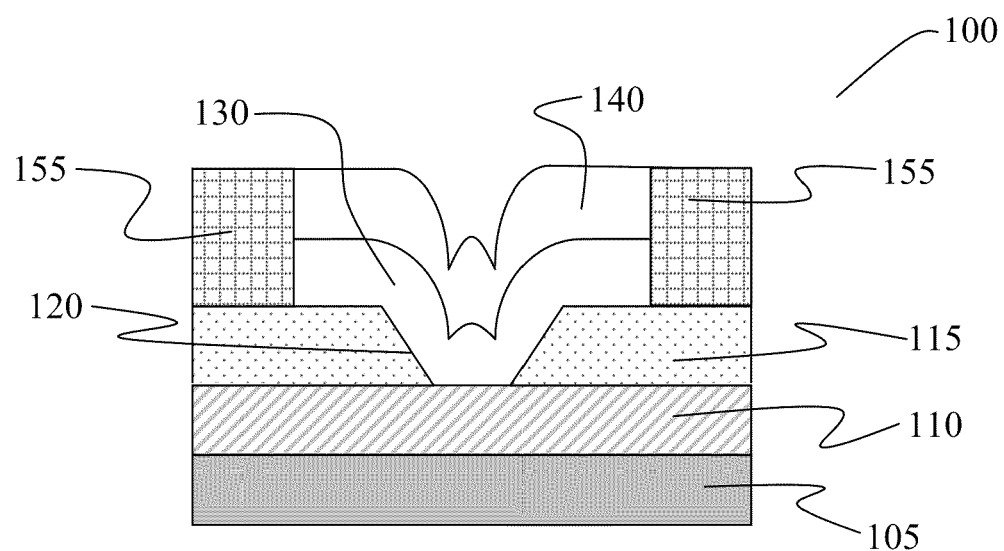
FIG. 5 depicts the device of FIG. 3 with the further inclusion of an isolating insulator layer.

Another common high temperature processing step is the formation of insulator layers following formation of upper electrode 140. An insulator layer may be formed over upper electrode 140 to protect the finished device from air, moisture or other external contaminants as well as from mechanical shock or scratching. Insulator layers are also incorporated into array structures to electrically isolate neighboring devices. Devices can be isolated by depositing a photoresist above the structure, masking the individual devices, removing the unmasked photoresist, etching the underlying unmasked layers and subsequently depositing an insulator in the opened areas. FIG. 5 shows an example of the structure of an isolated device. The structure includes insulator layer 155, which provides electrical isolation of active layer 130 and upper electrode 140 from adjacent devices in the array.

Insulator layer 155 is typically an oxide (e.g. $SiO_2$) or nitride (e.g. $Si_3N_4$) that is formed in a relatively high temperature HDP (high density plasma) deposition process, plasma enhanced chemical vapor deposition (PECVD) process, or chemical vapor deposition (CVD) process. In addition to concerns about volatilization of active layer 130, oxide and nitride deposition processes present the concern of contamination of active layer 130. Formation of oxide or nitride insulators requires introduction of precursor gases into the deposition environment. Gases such as $N_2$, $O_2$, NO, $NO_x$, $N_2O$, $SiH_4$, $SiH_2Cl_2$, and $H_2$ are commonly used in the formation of oxide and nitride insulators. During the formation process, the precursors react or decompose to produce insulator layer 155. During the formation process, active material 130 is exposed to the precursor gases (and to their reaction and decomposition products). If upper electrode 140 is non-conformal and/or porous, the precursor gases may penetrate it and enter active layer 130 via pores or channels present in upper electrode 140. This creates the possibility of chemical contamination of active layer 130 with elements such as N, O, Si, H, and Cl.

Figure 6:
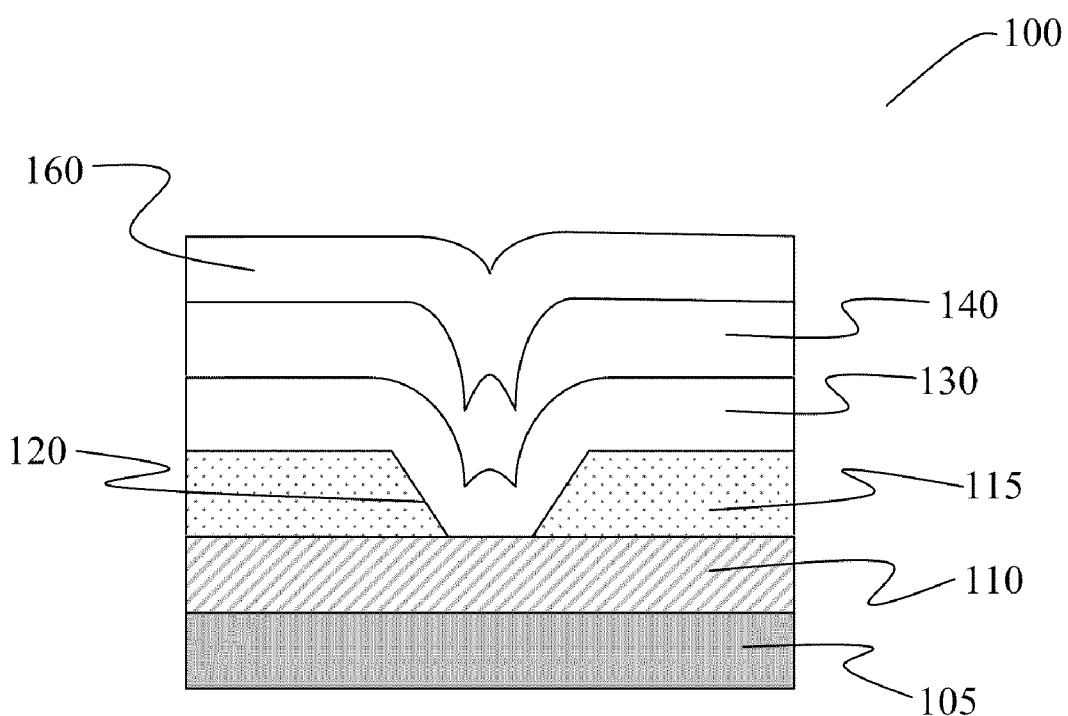
FIG. 6 depicts the device of FIG. 3 with the further inclusion of a containment layer.

In this invention, the deleterious volatilization and contamination effects described hereinabove for high temperature steps in conventional fabrication schemes are ameliorated through inclusion of a containment layer in the device structure. FIG. 6 depicts a representative device structure 100 that includes containment layer 160. Containment layer 160 is formed over upper electrode 140 in this embodiment. Containment layer 160 need not be strictly conformal, but must be sufficiently conformal and of sufficient thickness to block access to the pores or voids present in upper electrode 140. Further, the containment layer deposition must be at a sufficiently cool temperature, safely below the volatilization temperature of the active material 130. Containment layer 160 may be referred to herein as a semi-conformal layer. Although containment layer 160 may penetrate the upper surface of upper electrode 140, it resides primarily on or above the upper surface of upper electrode 140 to provide a physical barrier separating active material layer 130 from the ambient processing environment. Containment layer 160 may plug the entrances at the upper surface of upper electrode 140 to the porous network thereof. Containment layer 160 may also shield the upper surface openings of upper electrode 140 by providing a continuous envelope of material that surrounds and seals the openings.

By restricting or wholly preventing access to the void structure of upper electrode 140, the instant containment layer provides two significant benefits. First, containment layer 160 blocks exposure of active material layer 130 to ambient gases in the processing environment during fabrication. When containment layer 160 is in place, gases in the ambient processing environment are unable to enter the pore structure of upper electrode 140 and are prevented from migrating to active material layer 130. As a result, chemical contamination or reaction of active material layer 130 with ambient process gases is avoided. Second, containment layer 160 contains active material layer 130 and prevents volatilization thereof. When containment layer 160 is in place and the structure is subjected to high temperatures during fabrication, containment layer 160 prevents the escape of material from active material 130. As a result, the structure can be exposed to anneals and high temperature deposition steps without compromising the compositional or structural integrity of active material 130.

After fabrication of the device, the presence of containment layer 160 protects active material 130 from external contamination from the environment (e.g. oxygen or moisture from the atmosphere) and prevents escape of volatilized matter from active layer 130 during subsequent processing or during operation of the device. As described hereinabove, programming of a phase-change material to the amorphous or more amorphous state requires heating of the material to temperatures exceeding the melting temperature. Also, as described hereinabove, programming of a phase-change material to the crystalline or more crystalline state requires heating of the material to temperatures sufficient to promote rapid crystallization. While present in the heated or molten state, the phase-change material may volatilize. The presence of containment layer 160 seals the local environment of active material 130 to protect against loss of material and preserve the integrity of the layer.

In a preferred embodiment, containment layer 160 is formed via a low temperature process before active material 130 has been exposed to high temperature processing steps or processing environments that include chemical species that have the potential to contaminate it. In this embodiment, fabrication of electronic device 100 proceeds to the intermediate stage shown in FIG. 2. Active material 130 may be deposited via sputtering, physical vapor deposition, chemical vapor deposition, metalorganic chemical vapor deposition, plasma-enhanced chemical vapor deposition, solution-phase deposition, selective deposition, atomic layer deposition, evaporation or other means. Active material 130 may be a phase-change material, chalcogenide material, pnictide material, Ovonic threshold switch material or other electronic material. Active material 130 may include a plurality of layers. In one embodiment, active material 130 is a multilayer structure that includes chalcogenide or phase-change materials having different chemical compositions.

Figure 3:
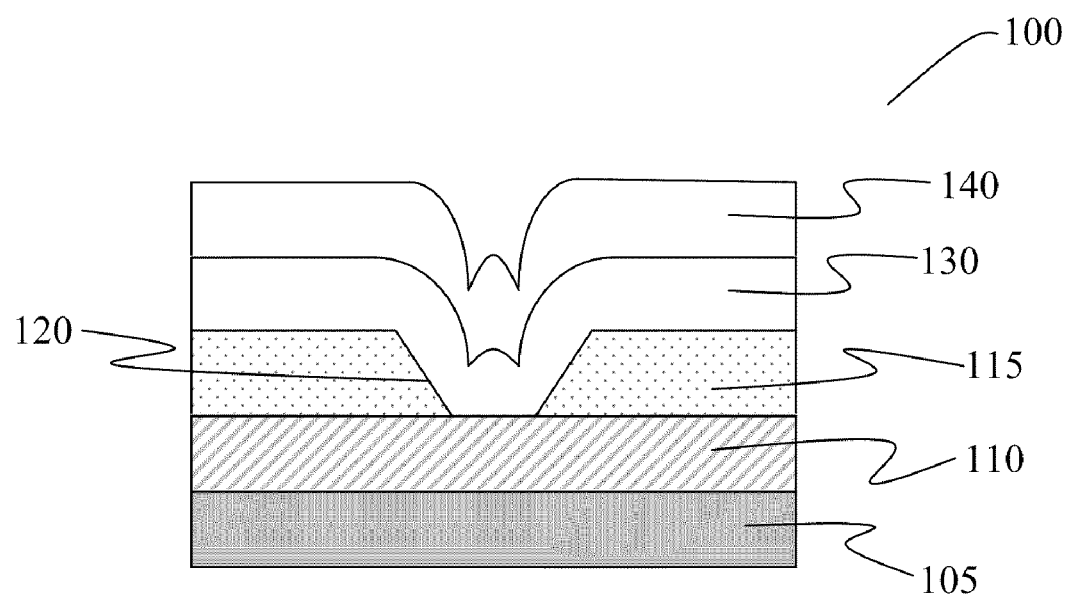
FIG. 3 depicts the device of FIG. 2 with the further inclusion of an upper electrode layer.

Once active material 130 is deposited, one or more additional layers are formed thereon using a process conducted at a temperature insufficient to appreciably volatilize the active material. The one or more additional layers may include a barrier layer, breakdown layer, and/or upper electrode layer. The upper electrode layer is formed from a conductive material and may include a combination of two or more conductive layers that differ in composition or resistivity. FIG. 3 illustrates an embodiment in which a single upper electrode layer 140 is deposited on active material 130. The one or more additional layers may be formed at low temperature via sputtering, physical vapor deposition, chemical vapor deposition, metalorganic chemical vapor deposition, plasma-enhanced chemical vapor deposition, solution-phase deposition, selective deposition, atomic layer deposition, evaporation or other means. In one embodiment, the temperature of deposition of each of the one or more additional layers is less than or equal to 80% of the volatilization temperature of active material 130. In another embodiment, the temperature of deposition of each of the one or more additional layers is less than or equal to 65% of the volatilization temperature of active material 130. In a further embodiment, the temperature of deposition of each of the one or more additional layers is less than or equal to 50% of the volatilization temperature of active material 130. In still another embodiment, the temperature of deposition of each of the one or more additional layers is less than 300° C.

After the last of the one or more additional layers is deposited, the device is preferably kept protected from high ambient temperatures and harsh chemical environments until after containment layer 160 is formed. Containment layer 160 is also formed at low temperature via sputtering, physical vapor deposition, chemical vapor deposition, metalorganic chemical vapor deposition, plasma-enhanced chemical vapor deposition, solution-phase deposition, selective deposition, atomic layer deposition, evaporation or other means. In one embodiment, the temperature of deposition of containment layer 160 is less than or equal to 80% of the volatilization temperature of active material 130. In another embodiment, the temperature of deposition of containment layer 160 is less than or equal to 65% of the volatilization temperature of active material 130. In a further embodiment, the temperature of deposition of containment layer 160 is less than or equal to 50% of the volatilization temperature of active material 130. In still another embodiment, the temperature of deposition of containment layer 160 is less than 300° C. By way of example, containment layer 160 may be an oxide (e.g. $SiO_2$) or nitride (e.g. $Si_3N_4$) deposited at 250° C. in a plasma-enhanced chemical vapor deposition process. In another example, containment layer 160 may be a metal formed in an energetic beam process (striking a metal target with an energetic electron or ion beam to eject elemental or molecular fragments of the metal that subsequently deposit on the electronic device) or an evaporation process.

In addition to structures in which active material 130 is formed in an opening such as shown in FIGS. 2-6 (pore cell design), the principles of the instant invention extend to other device structures. The beneficial sealing effect of the instant containment layer extends to any device structure including the lance cell, recessed lance cell, and microtrench cell designs as well as to device arrays.

EXAMPLE 1

Figure 7:
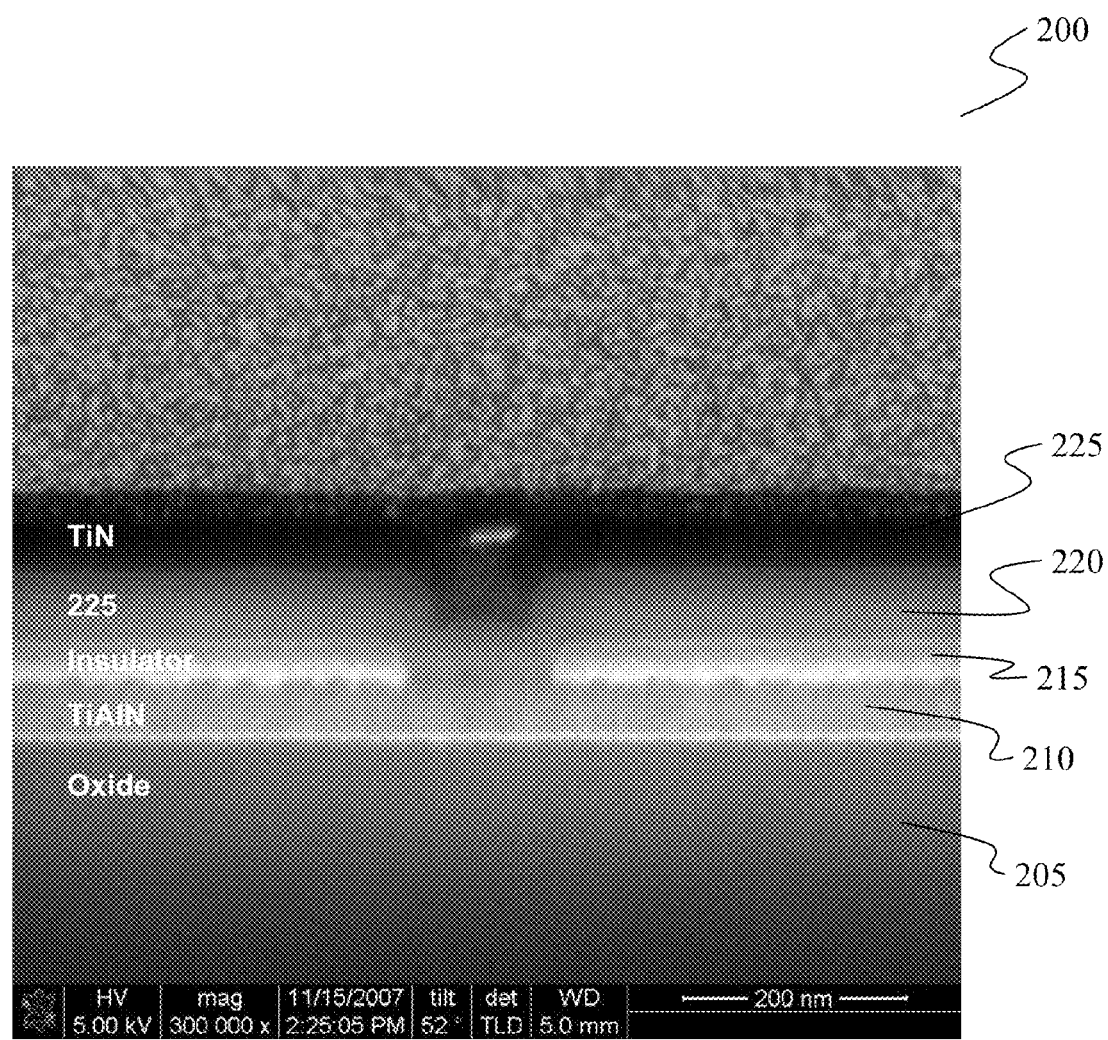
FIG. 7 is a cross-sectional micrograph of an illustrative phase-change memory device.

In this example, electronic devices having a pore cell design are compared and it is demonstrated that inclusion of a containment layer provides a significant extension of the cycle life of the device. A cross-sectional micrograph of the device used in this example is shown in FIG. 7. The device 200 includes substrate 205 that includes an oxide surface layer, a TiAlN lower electrode 210 (~650 Å thick), insulator 215 (~375 Å thick), active layer 220 that comprises a chalcogenide phase-change material ($Ge_2Sb_2Te_5$) (~750 Å thick), and a Ti/TiN upper electrode 225 (~20 Å of Ti in contact with active layer 220 and ~600 Å of TiN formed thereover). Substrate 205, lower electrode 210, and insulator 215 formed a base wafer upon which active layer 220 and upper electrode 225 were deposited using a low temperature sputtering process. Electronic device 200 has a pore cell design analogous to that shown in FIG. 3. Note that active layer 220 occupies an opening in insulator 215 (near center of FIG. 7) and that upper electrode 225 occupies a depression in active layer 220 located above the opening. The diameter of the opening in insulator 215 is ~1250 Å. The micrograph shown in FIG. 7 depicts the device in its as-fabricated state before any programming has occurred. FIG. 7 indicates that active layer 220 fills the opening in insulator layer 215. No voids were detected in the active layer 220 within the opening.

Figure 8:
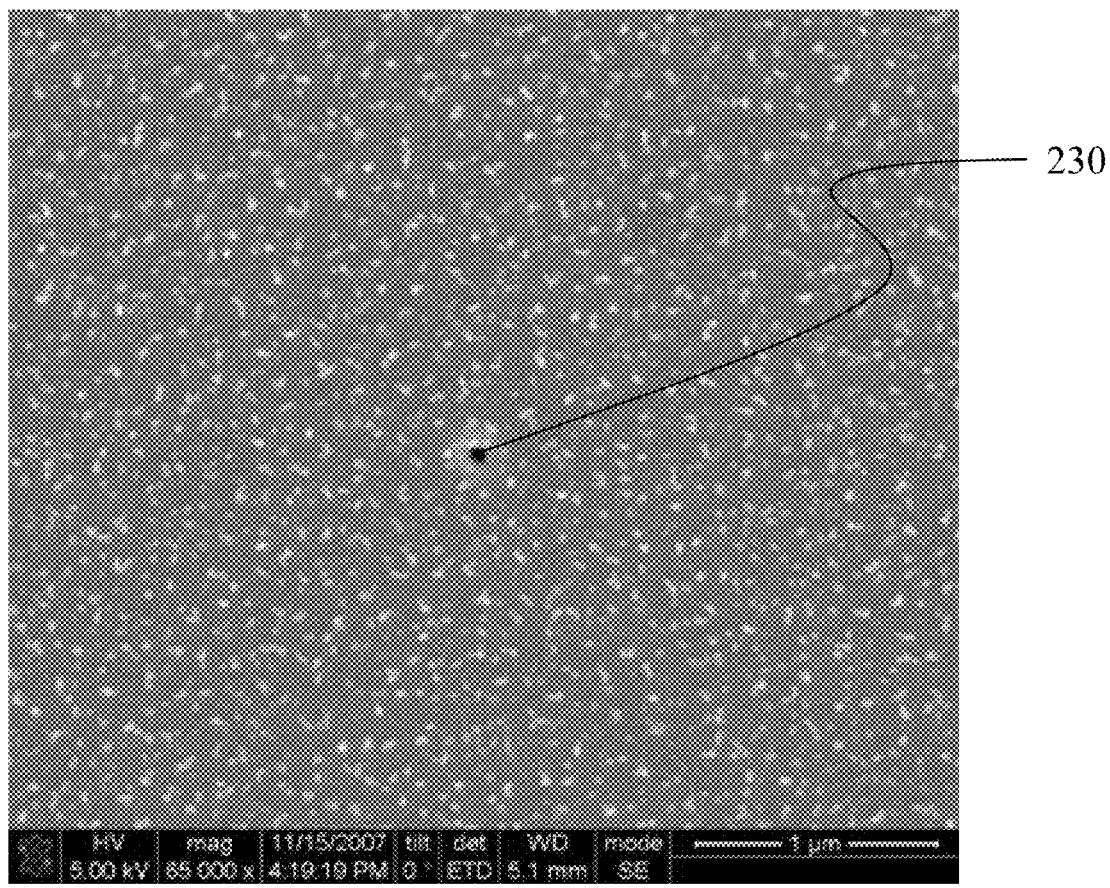
FIG. 8 is a top view of the device shown in FIG. 7.
Figure 9:
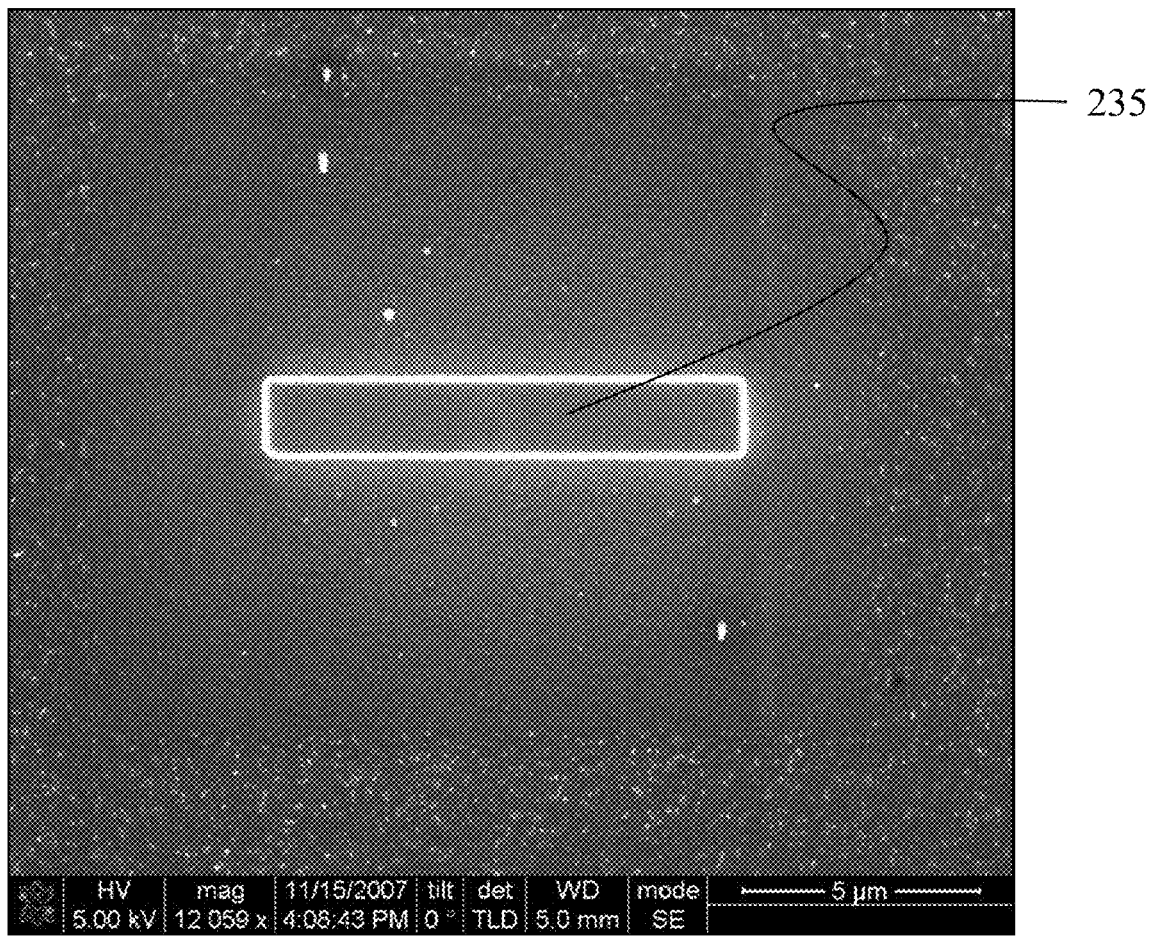
FIG. 9 is a top view of the device shown in FIG. 7, where the device further includes a containment layer.

A plurality of devices of the type shown in FIG. 7 was fabricated and tested for cycle life. Two series of cycle life tests were performed. In one series, devices having the structure shown in FIG. 7 were tested. In another series, a containment layer was deposited over upper electrode 225 and the structure was otherwise as shown in FIG. 7. FIG. 8 shows a top view of a device from the series lacking a containment layer. The noteworthy feature of FIG. 8 is the presence of depression 230 located above the opening layer of insulator 215. Depression 230 represents a structural irregularity that both exposes active layer 220 to the processing ambient and permits escape of volatilized matter from active layer 220 when it is heated during processing or operation to high temperatures. FIG. 9 shows the corresponding top view of a device from the series that includes rectangular containment layer 235 (the boundaries of which are highlighted in white). Containment layer 235 is a semi-conformal layer of Pt produced by an e-beam process. Containment layer 235 is formed directly over the opening of insulator 215 and effectively seals active layer 220. Ambient gases are unable to access active layer 220 and matter volatilized from active layer 220 is unable to escape.

Figure 10:
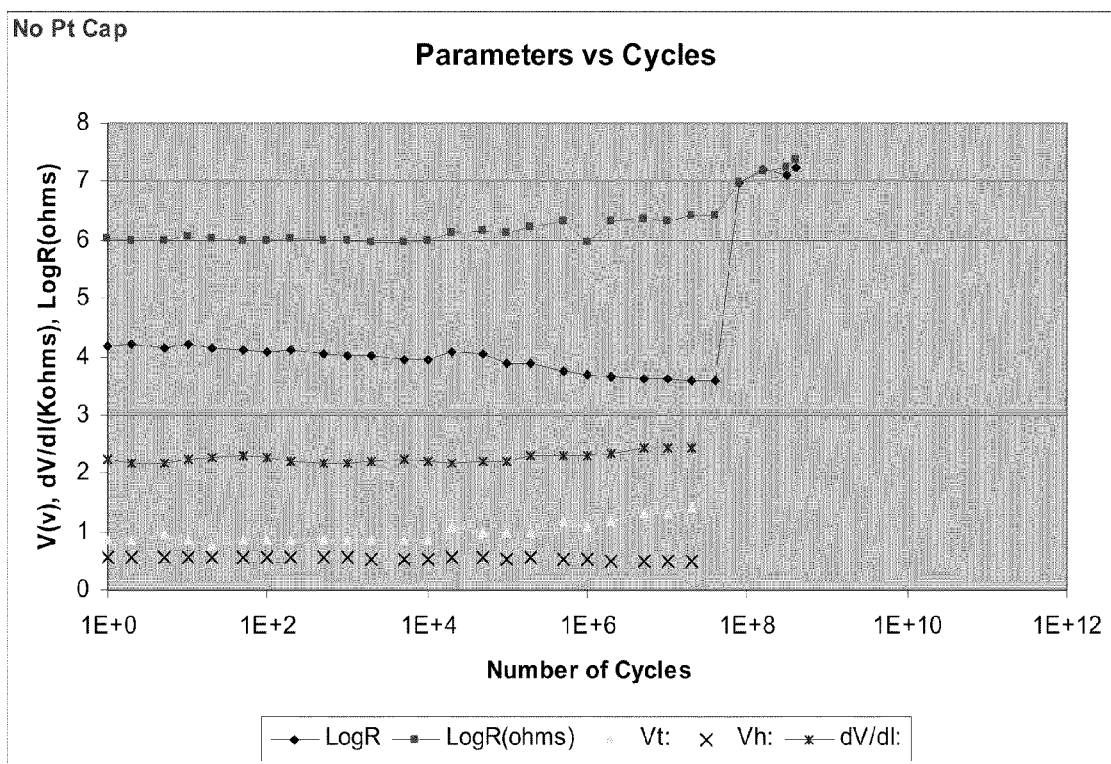
FIG. 10 shows cycle life results of a phase-change device lacking a containment layer.

The cycle life of devices with and without containment layer 235 were tested and compared. In the cycle life tests, the devices were repeatedly cycled back and forth between the set and reset states. The resistance of the set state and reset state produced during each cycle of operation was measured and recorded. Testing continued until device failure occurred. The results of cycle life testing of a representative device without a containment layer are shown in the upper two traces of FIG. 10. (The lower three traces of FIG. 10 show the cycling results for three other operational parameters of the device—$V_t$ (threshold voltage), $V_h$ (holding voltage), and dV/dI (slope of I-V response curve)—that are not of interest in the present discussion.) The uppermost trace shows the reset resistance of the device (~$10^6 \Omega$) and the next uppermost trace shows the set resistance of the device (~$10^4 \Omega$). Failure of the device is signified by the steep line emanating from the end of the set state trace. The results indicate that the device failed after about $4 \times 10^7$ cycles of operation and that the mode of failure was open circuit.

Figure 11:
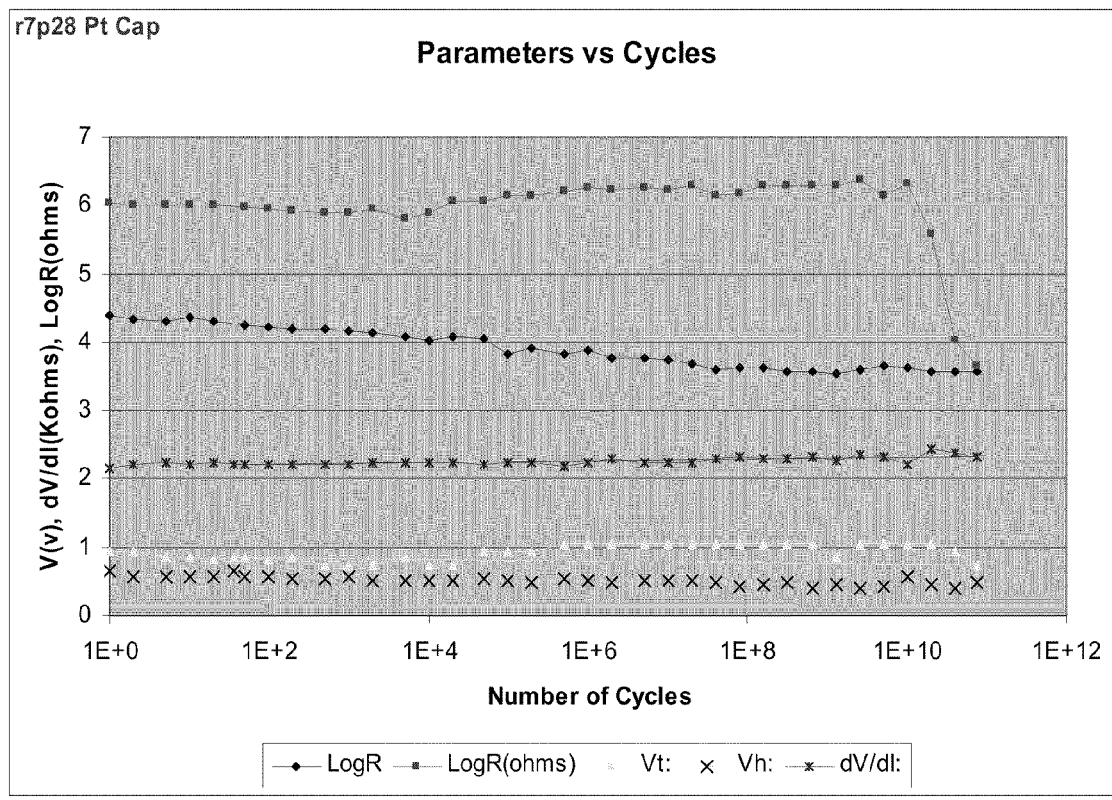
FIG. 11 shows cycle life results of a phase-change device with a containment layer.

The analogous results for a representative device that included a Pt containment layer are shown in FIG. 11. The upper two traces of FIG. 11 show the reset resistance of the device (~$10^6 \Omega$) and the next uppermost trace shows the set resistance of the device (~$10^4 \Omega$). The presence of the containment layer greatly extended the cycle life of the device. The device successfully performed to about $10^{10}$ cycles before failing. The results indicate that the mode of failure has changed to a "stuck set" failure.

Figure 12:
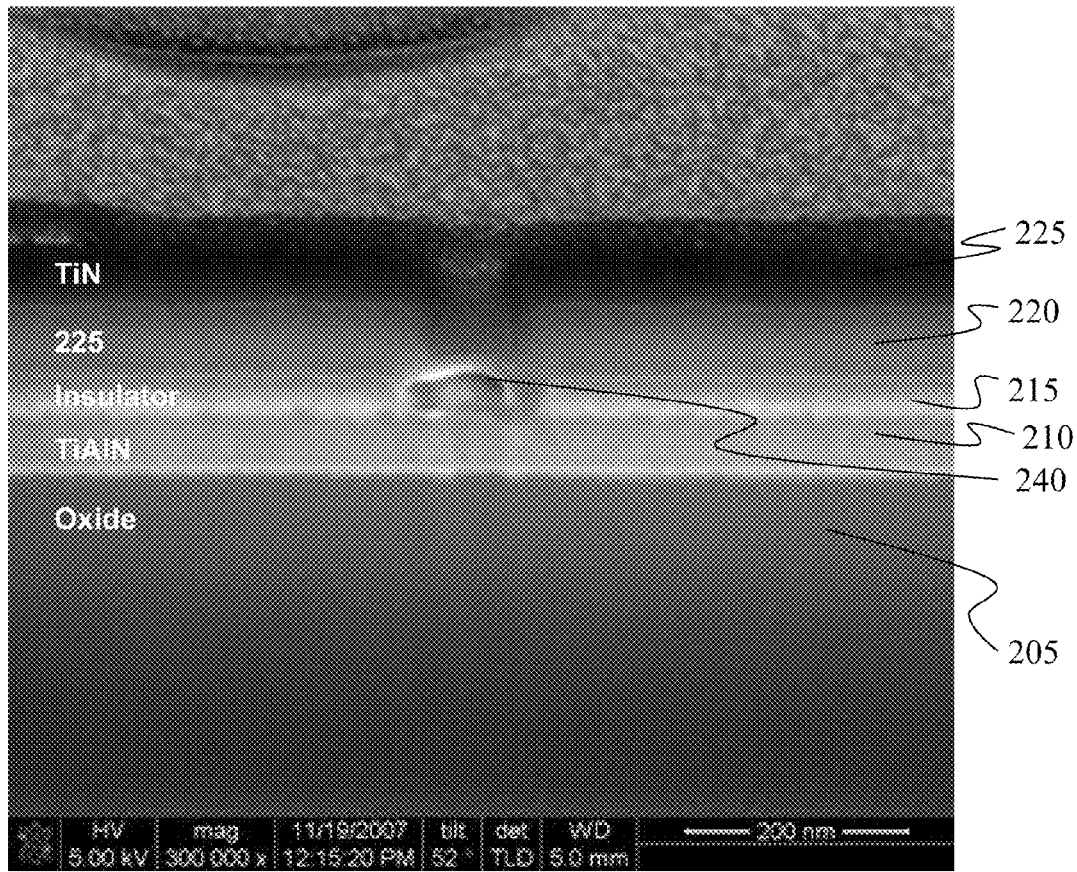
FIG. 12 is a cross-sectional micrograph of a phase-change device lacking a containment layer after failure.

FIG. 12 shows a cross-sectional micrograph of the device lacking a containment layer after failure. Of note in the micrograph is the presence of void 240. Void 240 represents an evacuated region within the opening of insulator 215 and suggests that failure of the device is due to volatilization of active layer 220. The lack of the confinement layer permits volatilization of active layer 220 and loss of matter from the operable part of the device. As indicated hereinabove, programming a phase-change device to the reset state entails applying an electric current pulse of sufficient magnitude to cause the phase-change material to melt. Also as indicated hereinabove, programming a phase-change device to the set state entails applying an electric current pulse of sufficient magnitude to cause the phase-change material to crystallize. While in the molten state or during crystallization, the phase-change material is volatile and volatilized portions can escape the device by exiting the structure through depression 230 shown in FIG. 8. The presence of depression 230 also permits atmospheric oxygen to access active layer 220 during the cycling process. The presence of oxygen in the vicinity of active layer 220 in a molten high temperature state or a crystallizing high temperature state may facilitate degradation of active layer 220 through oxidation or other chemical reaction. Volatilization and/or reaction of active layer 220 is expected to lead to premature failure of the device and is believed to be responsible for the low cycle life observed for the device.

Figure 13:
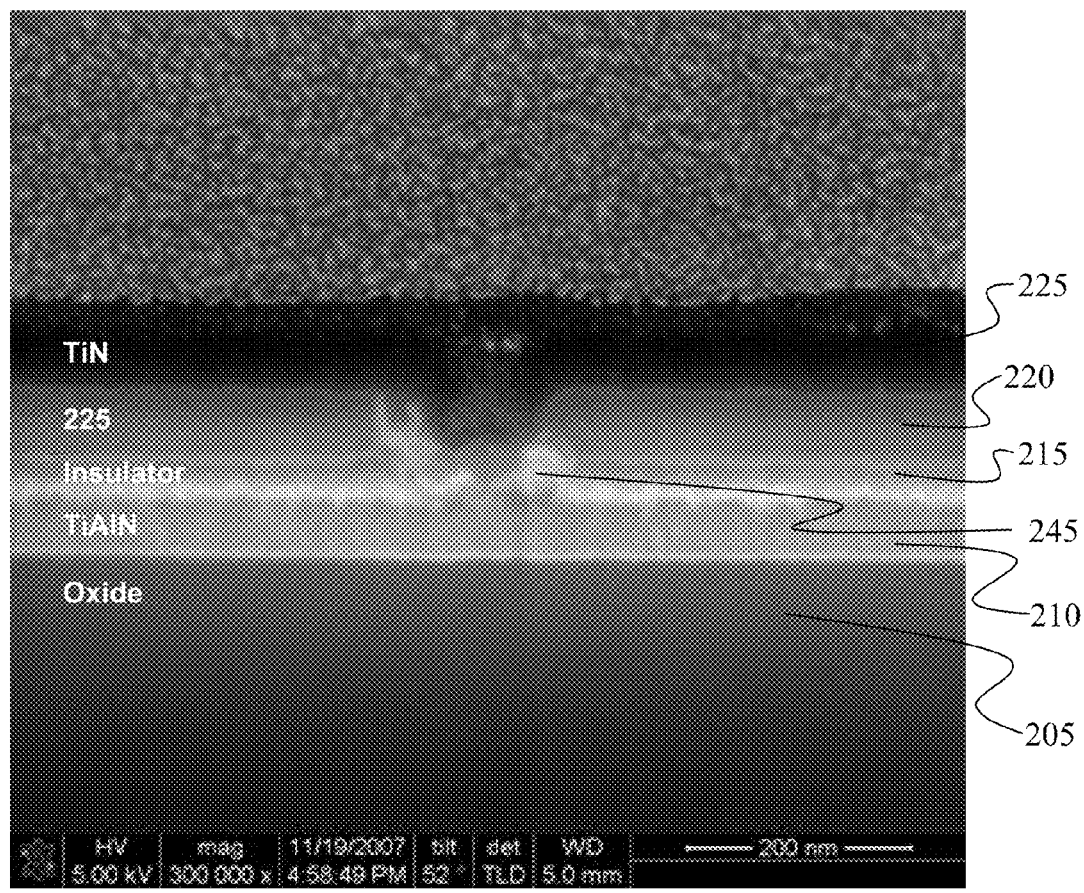
FIG. 13 is a cross-sectional micrograph of a phase-change device with a containment layer after failure.

FIG. 13 shows the corresponding micrograph of the device including containment layer 235 after failure. The micrograph indicates that no void is present within the opening of insulator 215. Instead, a crystalline aggregate 245 is observed. While not wishing to be bound by theory, the instant inventor believes that failure of the device may be due to the irreversible formation and segregation of crystalline $Ge_2Sb_2Te_5$ upon repeated cycling of the device. The crystalline phase is a low resistance phase that may provide a conductive pathway to upper electrode 225 that circumvents the opening of insulator 215. The crystalline aggregate 245 appears to bridge the gap between lower electrode 210 and the peripheral portion of active layer 220 (the portion away from the opening of insulator 215). Since the peripheral portion is expected to be more conductive than the amorphous phase of active layer 220, the presence of crystalline aggregate 245 provides a low resistance pathway between lower electrode 210 and upper electrode 225 that become permanent if crystalline aggregate 245 is incapable of being converted to an amorphous phase upon cycling.

The results of this example demonstrate the beneficial effect of including a containment layer in the structure of a phase-change device. The cycle life of the device was observed to increase by over two orders of magnitude by including the containment layer. The presence of the containment layer prevented premature failure due to volatilization or oxidation of active layer 220 and suggests a new mode of failure due to the irreversible formation and segregation of crystalline aggregates. A new direction for future work to further extend the cycle is suggested as well.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. The descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

We claim:

1. An electronic device comprising:
   a first electrode;
   an active material in electrical communication with said first electrode;
   a second electrode in electrical communication with said active material, said second electrode being porous and providing channels to said active material; and
   a containment layer formed over said second electrode, said containment layer covering said pores, said containment layer sealing said active material from the environment surrounding said device.

2. The device of claim 1, wherein said first and second electrodes comprise C, Ti, Ta, or Mo.

3. The device of claim 2, wherein said first and second electrodes further comprise N.

4. The device of claim 1, wherein said active material is selected from the group consisting of phase-change materials, chalcogenide materials, pnictide materials, and threshold switching materials.

5. The device of claim 1, wherein said active material comprises Te or Se.

6. The device of claim 5, wherein said active material further comprises Ge and Sb.

7. The device of claim 1, wherein said containment layer is an insulator.

8. The device of claim 7, wherein said containment layer is an oxide or nitride.

9. The device of claim 8, wherein said containment layer comprises Si.

10. The device of claim 1, wherein said containment layer is a conductive layer.

11. The device of claim 1, further comprising an insulator layer formed over said first electrode, said insulator layer having an opening, said opening exposing a portion of said first electrode, said active material having a portion formed in said opening.

12. The device of claim 11, wherein said second electrode overlies said opening.

13. The device of claim 1, further including a breakdown layer formed between said first electrode and said active material.

14. The electronic device of claim 1, wherein said containment layer overlies said first electrode.

15. The electronic device of claim 14, wherein said containment layer overlies said second electrode.

16. The electronic device of claim 1, wherein said containment layer penetrates the surface of said second electrode.

17. The electronic device of claim 1, wherein said containment layer blocks said pores.

18. The electronic device of claim 1, wherein said containment layer is in electrical communication with said second electrode.

19. The electronic device of claim 1, wherein said second electrode is in direct contact with said active material.

20. The electronic device of claim 19, wherein said first electrode is in direct contact with said active material.

21. The electronic device of claim 20, wherein said containment layer is in direct contact with said second electrode.

22. The electronic device of claim 1, wherein said active material includes a first depression.

23. The electronic device of claim 22, wherein said second electrode occupies said first depression.

24. The electronic device of claim 23, wherein said second electrode includes a second depression, said second depression overlying said first depression.

25. The electronic device of claim 24, wherein said containment layer occupies said second depression.

26. The electronic device of claim 11, wherein said active material is in direct contact with said exposed portion of said first electrode.

27. The electronic device of claim 26, wherein said second electrode overlies said portion of said active material formed in said opening.

28. The electronic device of claim 27, wherein said containment layer overlies said opening.

* * * * *